(12) United States Patent
Tian et al.

(10) Patent No.: US 12,520,660 B2
(45) Date of Patent: Jan. 6, 2026

(54) DISPLAY DEVICE

(71) Applicant: BOE Technology Group Co., Ltd., Beijing (CN)

(72) Inventors: Xueyan Tian, Beijing (CN); Xiongnan Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 376 days.

(21) Appl. No.: 18/271,035

(22) PCT Filed: Oct. 22, 2021

(86) PCT No.: PCT/CN2021/125511
§ 371 (c)(1),
(2) Date: Jul. 5, 2023

(87) PCT Pub. No.: WO2022/188412
PCT Pub. Date: Sep. 15, 2022

(65) Prior Publication Data
US 2024/0057375 A1    Feb. 15, 2024

(30) Foreign Application Priority Data

Mar. 9, 2021   (CN) .......................... 202110252885.4

(51) Int. Cl.
*H10K 50/854*    (2023.01)
*H10K 50/856*    (2023.01)
*H10K 50/86*     (2023.01)

(52) U.S. Cl.
CPC ......... *H10K 50/854* (2023.02); *H10K 50/856* (2023.02); *H10K 50/86* (2023.02)

(58) Field of Classification Search
CPC ..... H10K 50/854; H10K 50/86; H10K 50/856
USPC ....................................................... 313/506
See application file for complete search history.

(56) References Cited

U.S. PATENT DOCUMENTS

| | | | |
|---|---|---|---|
| 2009/0310071 A1* | 12/2009 | Hwang | ............. G02F 1/133504 |
| | | | 349/114 |
| 2017/0222183 A1* | 8/2017 | Cho | ..................... H10K 50/844 |
| 2018/0198093 A1 | 7/2018 | Yu | |
| 2021/0149245 A1 | 5/2021 | Li | |
| 2022/0384537 A1 | 12/2022 | Tian et al. | |

FOREIGN PATENT DOCUMENTS

| | | |
|---|---|---|
| CN | 106654046 A | 5/2017 |
| CN | 106654051 A | 5/2017 |
| CN | 210488187 U | 5/2020 |

(Continued)

OTHER PUBLICATIONS

CN202110252885.4 first office action.
PCT/CN2021/125511 international search report.

*Primary Examiner* — Christopher M Raabe
(74) *Attorney, Agent, or Firm* — IPro, PLLC

(57) ABSTRACT

The present application discloses a display device. The display device provided by the present application includes: a display substrate and a cover plate; a colored specular layer located between the display substrate and the cover plate, and including a metal reflecting layer and a selective reflecting film layer, the metal reflecting layer being located between the selective reflecting film layer and the display substrate; and a haze layer located between the display substrate and the cover plate, and having a haze of 20%-30%.

19 Claims, 2 Drawing Sheets

(56) References Cited

FOREIGN PATENT DOCUMENTS

| CN | 111900189 | A |   | 11/2020 |            |
|----|-----------|---|---|---------|------------|
| CN | 112673308 | A | * | 4/2021  | ......... H10K 59/8791 |
| CN | 112909208 | A |   | 6/2021  |            |
| JP | 2021121832| A | * | 8/2021  | ........... G09F 21/048 |

* cited by examiner

DISPLAY DEVICE

CROSS REFERENCE TO RELATED APPLICATIONS

The present application is a US National Stage of International Application No. PCT/CN2021/125511, filed on Oct. 22, 2021, which claims priority to Chinese Patent Application No. 202110252885.4, entitled "DISPLAY APPARATUS", filed to the China Patent Office on Mar. 9, 2021, the entire content of which is incorporated herein by reference.

TECHNICAL FIELD

The present application relates to the technical field of display, in particular to a display apparatus.

BACKGROUND

Glare refers to a visual phenomenon that causes an uncomfortable feeling or reduces an ability to observe details or targets due to improper brightness distribution or range in the field of vision (such as extreme contrast). The glare on a screen of a display apparatus may cause a decrease in image display ability and may cause eye health issues, such as temporary discomfort, fatigue and decreased vision in the eyes.

A currently developed colored specular organic light-emitting diode (OLED) display screen usually has various colors and strong metallic luster. As decoration, a Bling Bling appearance effect is produced, and the colored specular OLED display screen has a high specular reflectivity and a strong dazzling effect.

SUMMARY

The present application discloses a display apparatus, to improve a structure of a display screen and provide a colored specular display apparatus having a bright color and a super matte feeling.

In order to achieve the above purposes, the present application provides the following technical solutions.

A display apparatus, includes:
a display substrate and a cover plate;
a colored specular layer, located between the display substrate and the cover plate, and including a metal reflecting layer and a selective reflecting film layer, where the metal reflecting layer is located between the selective reflecting film layer and the display substrate; and
a haze layer, located between the display substrate and the cover plate, and having a haze of 20%-30%.

Optionally, the haze layer is located between the cover plate and the colored specular layer.

Optionally, the display apparatus includes a polarizer located between the cover plate and the colored specular layer, the polarizer includes at least one supporting layer, and any one of the at least one supporting layer is configured as the haze layer.

Optionally, the at least one supporting layer includes: a first supporting layer close to the cover plate, and a second supporting layer located on one side, away from the cover plate, of the first supporting layer; and the first supporting layer is configured as the haze layer.

Optionally, a haze of the second supporting layer is smaller than or equal to 1%.

Optionally, the display apparatus includes at least one optical adhesive layer located between the display substrate and the cover plate, and any one of the at least one optical adhesive layer is configured as the haze layer.

Optionally, the selective reflecting film layer is a composite film layer composed of at least two materials, and refractive indexes of the at least two materials are different.

Optionally, the metal reflecting layer includes an aluminum metal film layer; and the selective reflecting film layer includes a $SiN_x/SiO_2/SiN_x$ composite film layer.

Optionally, in the $SiN_x/SiO_2/SiN_x$ composite film layer, a thickness of a $SiO_2$ film layer ranges from 50 nm to 170 nm; and an international commission on illumination (CIE) color system brightness value of the display apparatus ranges from 60 to 80.

Optionally, the metal reflecting layer includes a molybdenum metal film layer; and the selective reflecting film layer includes a $SiN_x/SiO_2/SiN_x$ composite film layer.

Optionally, in the $SiN_x/SiO_2/SiN_x$ composite film layer, a thickness of a $SiO_2$ film layer ranges from 50 nm to 190 nm; and a CIE color system brightness value of the display apparatus ranges from 30 to 60.

Optionally, the metal reflecting layer has a plurality of first openings, and the plurality of first openings are configured to expose OLED elements of the display substrate; and an overlapping area between the metal reflecting layer and an opening of a pixel defining layer of the display substrate is smaller than 20%.

Optionally, the haze layer has a plurality of second openings, and the plurality of second openings are configured to expose OLED elements of the display substrate.

Optionally, the haze layer includes a plurality of haze parts distributed in an array, and the plurality of haze parts are configured to cover OLED elements of the display substrate.

Optionally, a haze of the haze layer is 25%.

Optionally, the haze layer includes an adhesive material and scattering particles; and the scattering particles are dispersed in the adhesive material, or the scattering particles are coated on a surface of one side, facing the cover plate, of the adhesive material.

Optionally, the scattering particles are spherical, and diameters of the scattering particles range from 2 μm to 9 μm.

Optionally, the haze layer includes at least two types of scattering particles with different diameters.

Optionally, the adhesive material is a tri-cellulose acetate material; and the scattering particles are acrylic materials or silica materials.

DETAILED DESCRIPTION

The technical solutions in embodiments of the present application will be clearly and completely described in the following with reference to accompanying drawings in the embodiments of the present application. Apparently, the described embodiments are merely some rather than all of the embodiments of the present application. Based on the embodiments in the present application, all other embodiments obtained by those of ordinary skill in the art without creative efforts shall fall within the protection scope of the present application.

Figure 1:
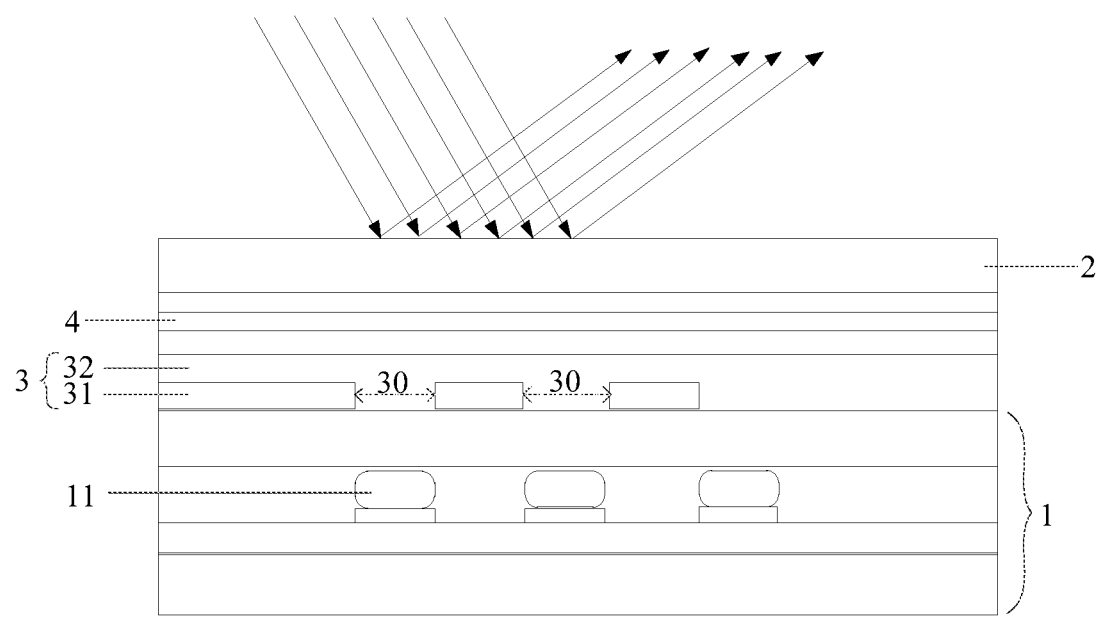
FIG. 1 is a schematic cross-sectional view of a display apparatus provided by an embodiment of the present application.
Figure 2:
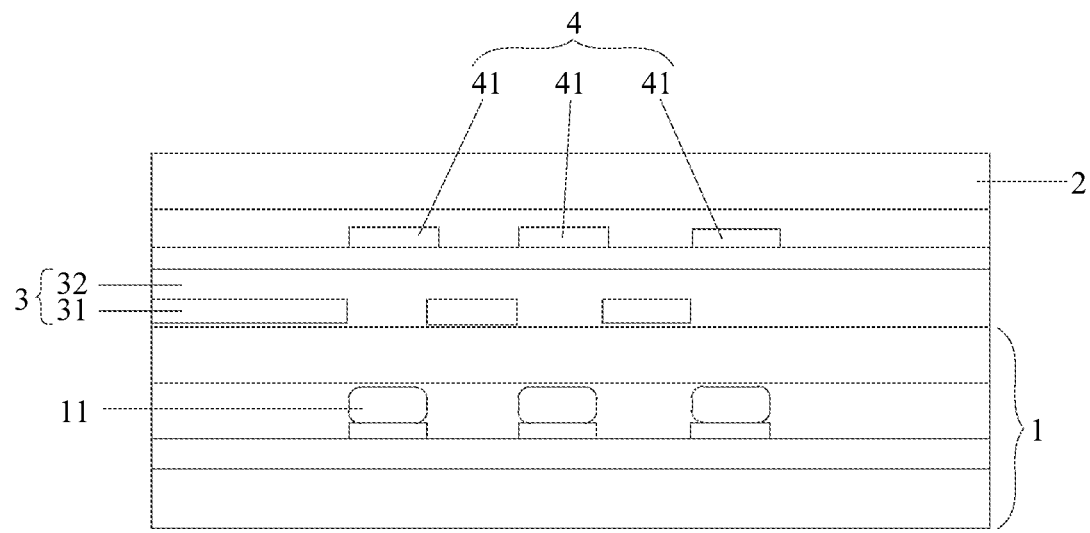
FIG. 2 is a schematic cross-sectional view of a display apparatus provided by another embodiment of the present application.

As shown in FIG. 1 and FIG. 2, embodiments of the present application provide a display apparatus, including:
- a display substrate 1 and a cover plate 2;
- a colored specular layer 3, located between the display substrate 1 and the cover plate 2, and including a metal reflecting layer 31 and a selective reflecting film layer 32, where the metal reflecting layer 31 is located between the selective reflecting film layer 32 and the display substrate 1; and
- a haze layer 4, located between the display substrate 1 and the cover plate 2, and having a haze of 20%-30%.

According to the display apparatus provided by the present disclosure, the colored specular layer 3 is arranged between the display substrate 1 and the cover plate 2, so that the display screen has colors. In addition, the haze layer 4 with the haze of 20%-30% is further arranged between the display substrate 1 and the cover plate 2, so that the display screen has an excellent anti-dazzling effect, has an overall effect of soft brightness, bright color and super matte feeling, and has a good viewing experience.

Specifically, haze refers to a cloudy or muddy appearance caused by light diffusion on an interior or surface of a transparent or semi-transparent material. Taking a percentage of a ratio of luminous flux of diffusion and luminous flux of a transmission material for representation, specifically, a beam of parallel light of a standard "c" light source is vertically irradiated on a transparent or semi-transparent thin film, sheet and plate; and due to scattering of the interior and the surface of the material, part of the parallel light deviates from an incidence direction. The haze is the percentage of the ratio of the scattered luminous flux Td that deviates from the incidence direction by greater than 2.5° to the luminous flux T2 of the transmission material, which is an important parameter for the optical transparency of the transparent or semi-transparent material. Haze and transmittance are two concepts. Materials with a high haze may have relatively high transmittance, and if such materials are used for window glass, a room will appear bright during the day, and concealment is also achieved.

According to experimental research and analysis of the inventor, when the haze of the haze layer is greater than 30%, a diffuse reflectivity increases, the clarity of a display effect may be affected, and the transmittance may be reduced; and when the haze of the haze layer is smaller than 20%, the amplitude of the diffuse reflectivity is insufficient, and the metallic matte feeling of the display screen may be reduced. Therefore, a haze value of the haze layer in the embodiments of the present application is set within a certain range, namely 20%-30%.

In a specific embodiment, the haze of the haze layer is 25%.

At present, manufacturers have been invited to produce haze layers with different hazes (haze conditions: 25%, 40% and 50%) for testing. The analysis of test results shows that the display effect of the haze of 25% is good, a best anti-dazzling effect is achieved, reduction of brightness is small, a display picture is clear, and a super high image quality is achieved.

In a specific embodiment, as shown in FIG. 1 and FIG. 2, the haze layer 4 is located between the cover plate 2 and the colored specular layer 3.

Exemplarily, in the colored specular layer 3, the selective reflecting film layer 31 may be a composite film layer composed of at least two materials, and refractive indexes of the at least two materials are different.

A Lab color system will be taken as an example to illustrate a screen viewing effect of the display apparatus provided by the embodiments of the present application below.

Specifically, international commission on illumination (CIE) L*a*b* is a color system of CIE, and Lab values respectively represent brightness, red-green chromaticity and yellow-cyan chromaticity of a color. The larger an L value, the higher the brightness of the color. When a>0, it indicates that the color is a red series; and the larger the value of a, the redder the color. When a<0, it indicates that the color belongs to a green series. When b>0, it is a yellow series; and when b<0, it is the b cyan series. The L value (brightness) is between 0 and 100, 0 indicates black, and 100 indicates white; the value of a (red chromaticity) indicates color and luster between red and green, 100 indicates red, and −80 indicates green; and the value of b (yellow chromaticity) indicates color and luster between yellow and blue, 100 indicates yellow, and −80 indicates blue.

A regularized formula may be used to calculate a range of different haze values of the haze layer. Specifically, the haze layer is additionally arranged between the colored specular layer and the cover plate, so that the screen brightness of the display apparatus is reduced; and the formula may refer to: brightness reduction value=haze value*brightness value of an original colored specular screen. For values of the colors ab, after the haze layer is additionally arranged, according to selectivity of different metals and different color wavebands, the color will become brighter compared to the color before additionally arranging the haze layer.

In a specific embodiment, as shown in FIG. 1 and FIG. 2, in the colored specular layer 3, the metal reflecting layer 31 includes an aluminum metal film layer; and the selective reflecting film layer 32 includes a $SiN_x/SiO_2/SiN_x$ composite film layer.

Exemplarily, in the $SiN_x/SiO_2/SiN_x$ composite film layer, a thickness of a $SiO_2$ film layer ranges from 50 nm to 170 nm; and a CIE color system brightness value of the display apparatus ranges from 60 to 80.

According to the display apparatus provided by the embodiments of the present application, a colored specular layer adopting aluminum is adopted, and the haze layer is matched with the colored specular layer, so that the screen of the display apparatus has soft brightness, bright color and an obvious matte effect, and the specific effects may refer to Lab color data in Table 1.

TABLE 1

| Color system | Al | SiN$_x$ | SiO$_2$ | SiN$_x$ | Display apparatus without haze layer | | | Display apparatus added with haze layer with a haze of 25% | | |
|---|---|---|---|---|---|---|---|---|---|---|
| | | | | | L* | a* | b* | L* | a* | b* |
| Yellow | 330 nm | 60 nm | 50 nm | 60 nm | 94.94 | −8.60 | 3.62 | 70.94 | −4.6 | 19.71 |
| Purple | | | 90 nm | | 91.07 | −9.19 | −9.41 | 65.82 | 15.90 | −8.1 |
| Purple blue | | | 110 nm | | 88.38 | −0.12 | −13.84 | 64.99 | 7.70 | −14.8 |
| Blue | | | 130 nm | | 87.99 | 12.90 | −11.54 | 66.83 | −7.2 | −12.0 |
| Green | | | 170 nm | | 93.34 | 1.99 | 11.49 | 71.03 | −10.9 | 3.18 |

Specifically, as shown in Table 1, a conventional colored specular layer screen adopting aluminum usually has a strong specular feeling (referring to numerical values of L*, a* and b* of the display apparatus without the haze layer 4 in Table). In the display apparatus provided by the embodiments of the present application, by adding the haze layer with a haze of 25%, the brightness of the screen of the display apparatus is reduced, and the color is brighter (referring to numerical values of L*, a* and b* of the display apparatus added with the haze layer with a haze of 25% in Table). Based on the above comparison, it may be seen that compared to the effect of strong specular feeling of the conventional colored screen adopting aluminum, the screen of the display apparatus provided by the embodiments of the present application has an anti-dazzling and strong matte viewing feeling, soft brightness, bright color and better visual experience.

In a specific embodiment, as shown in FIG. 1 and FIG. 2, in the colored specular layer 3, the metal reflecting layer 31 includes a molybdenum metal film layer; and the selective reflecting film layer 32 includes a SiN$_x$/SiO$_2$/SiN$_x$ composite film layer.

Exemplarily, in the SiN$_x$/SiO$_2$/SiN$_x$ composite film layer, a thickness of a SiO$_2$ film layer ranges from 50 nm to 190 nm; and a CIE color system brightness value of the display apparatus ranges from 30 to 60.

According to the display apparatus provided by the embodiments of the present application, a colored specular layer adopting molybdenum is adopted, and the haze layer is matched with the colored specular layer, so that the screen of the display apparatus has soft brightness, bright color and an obvious matte effect, and the specific effects may refer to Lab color system data in Table 2.

present application, by adding the haze layer with a haze of 25%, the brightness of the screen of the display apparatus is reduced, and the color is brighter (referring to numerical values of L*, a* and b* of the display apparatus added with the haze layer with a haze of 25% in Table). Based on the above comparison, compared to the effect of strong metal feeling of the conventional colored screen adopting molybdenum, the screen of the display apparatus provided by the embodiments of the present application has an anti-dazzling and strong matte viewing feeling, soft brightness, bright color and better visual experience.

Of course, the metal reflecting layer is not limited to aluminum and molybdenum. The proper metal layers are adopted to be matched with the haze layer, so that a specular reflective display apparatus with required brightness and bright color may be obtained. In addition, the selective reflecting film layer is also not limited to a three-layer composite film layer of SiN$_x$/SiO$_2$/SiN$_x$, but may also be expanded into multiple layers, such as adopting more than five layers of optical thin films; and the selective reflecting film layer is also not limited to inorganic thin films with high and low refractive index materials, such as SiN$_x$ and SiO$_2$, for example, the high refractive index material may be selected from other materials such as TiO$_2$.

In a specific embodiment, as shown in FIG. 1 and FIG. 2, the metal reflecting layer 31 has a plurality of first openings 30, and the plurality of first openings 30 are configured to expose OLED elements 11 of the display substrate 1; and an overlapping area between the metal reflecting layer 31 and an opening of a pixel defining layer of the display substrate 1 is smaller than 20%.

TABLE 2

| Color system | Mo | SiN$_x$ | SiO$_2$ | SiN$_x$ | Display apparatus without haze layer | | | Display apparatus added with haze layer with a haze of 25% | | |
|---|---|---|---|---|---|---|---|---|---|---|
| | | | | | L* | a* | b* | L* | a* | b* |
| Yellow | 330 nm | 60 nm | 50 nm | 60 nm | 64.23 | 16.55 | 46.43 | 51.92 | 0.89 | 69.29 |
| Orange | | | 70 nm | | 52.71 | 46.61 | −10.83 | 43.02 | 33.40 | 16.48 |
| Purple | | | 90 nm | | 43.61 | 52.65 | −50.17 | 32.58 | 64.47 | −40.4 |
| Purple blue | | | 110 nm | | 46.86 | 9.20 | −54.48 | 30.16 | 40.13 | −61.2 |
| Blue | | | 130 nm | | 57.65 | −30.23 | −36.54 | 38.83 | −18.3 | −45.2 |
| Green blue | | | 150 nm | | 67.09 | −38.37 | −11.82 | 47.88 | −39.2 | −18.7 |
| Green | | | 170 nm | | 72.68 | −34.72 | 17.84 | 53.63 | −39.0 | 12.31 |
| Green yellow | | | 190 nm | | 74.51 | −24.82 | 46.94 | 56.07 | −31.7 | 45.91 |

Specifically, as shown in Table 2, a conventional colored specular layer adopting molybdenum usually has a strong metal feeling (referring to numerical values of L*, a* and b* of the display apparatus without the haze layer in Table). In the display apparatus provided by the embodiments of the Specifically, the metal reflecting layer is patterned, and the plurality of first openings are arranged, so that transmittance may be increased, and the overall display brightness of the display apparatus is improved.

Exemplarily, the plurality of first openings 30 are in one-to-one correspondence with the OLED elements 11, and each first opening 30 exposes the corresponding OLED element 11.

In a specific embodiment, the haze layer 4 has a plurality of second openings (not shown in the figure), and the plurality of second openings are configured to expose OLED elements 11 of the display substrate 1.

Specifically, the haze layer 4 is patterned, and the plurality of second openings are arranged, so that transmittance may be increased, and the overall display brightness of the display apparatus is improved.

Exemplarily, the plurality of second openings are in one-to-one correspondence with the OLED elements 11, and each second opening exposes the corresponding OLED element 11.

In a specific embodiment, as shown in FIG. 2, the haze layer 4 includes a plurality of haze parts 41 distributed in an array, and the plurality of haze parts 41 are configured to cover OLED elements 11 of the display substrate 1.

Specifically, the haze layer is patterned, and the plurality of haze parts are arranged, to cover the OLED elements. On the one hand, the matte effect of the display screen may be ensured to the maximum extent; and on the other hand, display light may pass through the plurality of haze parts, so that the transmittance may be increased, and the overall display brightness of the display apparatus is improved.

Of course, the haze layer 4 is not limited to the above patterned structure, and may also be set as a whole layer structure (as shown in FIG. 1).

Figure 3:
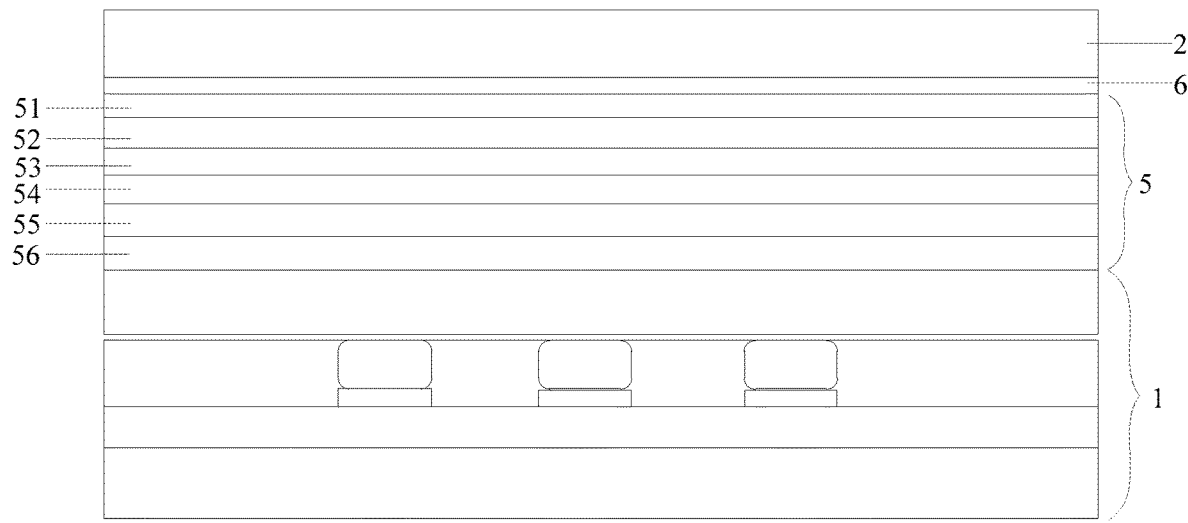
FIG. 3 is a schematic cross-sectional view of a display apparatus provided by another embodiment of the present application.

In a specific embodiment, as shown in FIG. 3, the display apparatus provided by the present application includes a polarizer 5 located between the cover plate 2 and the colored specular layer (not shown in FIG. 3), the polarizer 5 includes at least one supporting layer (such as a first supporting layer 51 and a second supporting layer 53 in FIG. 3), and any one of the at least one supporting layer is configured as the haze layer.

Exemplarily, the above polarizer 5 is a circular polarizer.

Exemplarily, the above at least one supporting layer includes: a first supporting layer 51 close to the cover plate 2, and a second supporting layer 53 located on one side, away from the cover plate 2, of the first supporting layer 51; and the first supporting layer 51 is configured as the haze layer.

Exemplarily, a haze of the second supporting layer 53 is smaller than or equal to 1%.

For example, in a direction from the cover plate 2 to the display substrate 1, the polarizer 5 includes: the first supporting layer 51, a polarized layer 52, the second supporting layer 53, a first pressure-sensitive adhesive layer 54, a phase retardation layer 55 and a second pressure-sensitive adhesive layer 56 which are sequentially arranged. The supporting layers adopt tri-cellulose acetate (TAC) materials, the phase retardation layer 55 adopts a polyvinyl alcohol (PVA) material, and the first supporting layer 51 is subject to haze processing to be used as the haze layer.

Specifically, the supporting layer in the polarizer is subject to haze processing, so that a haze value of the supporting layer is increased to be 20%-30%. On the one hand, the display screen may have an anti-dazzling effect and a super high image quality; and on the other hand, there is no need to additionally arrange a haze film layer, a thickness of the display screen may not be increased, and the impact on the brightness of the display screen is also small.

In a specific embodiment, as shown in FIG. 3, the display apparatus provided by the embodiments of the present application includes at least one optical adhesive layer located between the display substrate 1 and the cover plate 2 (such as a first optical adhesive layer 6, a first pressure-sensitive adhesive layer 54 and a second pressure-sensitive adhesive layer 56 in FIG. 3), and any one of the at least one optical adhesive layer is configured as the haze layer.

Exemplarily, the above optical adhesive layer configured as the haze layer may be an adhesive layer in the polarizer, for example, as shown in FIG. 3, it may be the first pressure-sensitive adhesive layer 54 or the second pressure-sensitive adhesive layer 56 in the polarizer 5.

Or, the above optical adhesive layer configured as the haze layer may also be an adhesive layer configured to bond different structures in the display screen. For example, as shown in FIG. 3, it may be the first optical adhesive layer 6 configured to connect the polarizer 5 and the cover plate 2.

In a specific embodiment, the haze layer includes an adhesive material and scattering particles; and the scattering particles are dispersed in the adhesive material, or the scattering particles are coated on a surface of one side, facing the cover plate, of the adhesive material.

Specifically, the monomer of the adhesive material is doped with particles having a scattering function, which may scatter part of the light, to achieve a haze effect.

Exemplarily, the adhesive material is a tri-cellulose acetate material; and the scattering particles are acrylic materials or silica.

Exemplarily, the scattering particles are spherical, and diameters of the scattering particles range from 2 μm to 9 μm.

Exemplarily, the haze layer includes at least two types of scattering particles with different diameters.

Specifically, the scattering particles made of the acrylic or silica materials are dispersed into the monomer of the adhesive material to form an optical film layer, so that micrometer-sized concave-convex surfaces may be formed in the optical film layer; and these concave-convex surfaces may cause incident light to diverge and play a role of light diffusion. In addition, due to a spherical shape of the scattering particles, their function is similar to that of a convex lens. When the light passes through these particles, it is focused within a certain emission angle, thereby achieving a function of ensuring the brightness. In addition, the scattering particles with different particle sizes also ensure that light cannot be directly emitted out from the diffusion film, thereby further achieving the haze effect. Moreover, the haze may be controlled by controlling the concentration of the scattering particles; and the more the scattering particles, the more dispersed the scattering light, and the greater the haze.

Of course, in the embodiments of the present application, the haze layer is not limited to the settings in the above embodiments, and other methods may also be adopted to perform haze processing, for example, the surface of the optical film layer may be etched to form the haze effect, which will not be repeated here one by one.

In addition, in the embodiments of the present application, the haze layer may also be located between the cover plate and the colored specular layer, and the effects of improving the viewing experience of the display screen and improving display image quality may be achieved.

Specifically, in the display apparatus provided by the embodiments of the present application, the display substrate may be a low temperature poly-silicon thin film transistor (LTPS-TFT) active-matrix organic light-emitting diode (AMOLED) or indium gallium zinc oxide thin film transistor (IGZO-TFT) AMOLED display structure, or may also be a liquid crystal display (LCD) panel.

Specifically, the display screen of the display apparatus provided by the embodiments of the present application has colors; and specifically, the display screen has the viewing effects of soft brightness, bright colors and strong matte feeling. Moreover, the reduction of the brightness of the display screen is small, the display picture is clear, a super high image quality is achieved, and the viewing experience can be significantly improved.

The display apparatus provided by the embodiments of the present application may be applied to a display device such as a display and a mobile phone, especially suitable for application of a flexible colored OLED wearable display for outdoor use, an OLED mobile screen, an OLED laptop, a vehicle-mounted rearview mirror, a driving recorder and a head-up display product.

It needs to be illustrated that, in some embodiments of the present disclosure, the display apparatus may further include other structures, which may be determined according to the actual needs and is not limited in the embodiments of the present disclosure. In addition, the materials and specific parameters of each structure provided by the embodiments of the present disclosure are not limited to the above embodiments, and the basic requirements may refer to the description above, which will not be repeated here.

Apparently, those skilled in the art can make various modifications and variations to the embodiments of the present application without departing from the spirit and scope of the present application. In this way, under the condition that these modifications and variations of the present application fall within the scope of the claims of the present application and their equivalent technologies, the present application is also intended to include these modifications and variations.

What is claimed is:

1. A display apparatus, comprising:
   a display substrate and a cover plate;
   a colored specular layer, located between the display substrate and the cover plate, and comprising a metal reflecting layer and a selective reflecting film layer, wherein the metal reflecting layer is located between the selective reflecting film layer and the display substrate; and
   a haze layer, located between the display substrate and the cover plate, and having a haze of 20%-30%.

2. The display apparatus according to claim 1, wherein the haze layer is located between the cover plate and the colored specular layer.

3. The display apparatus according to claim 2, comprising a polarizer located between the cover plate and the colored specular layer;
   wherein the polarizer comprises at least one supporting layer, and any one of the at least one supporting layer is configured as the haze layer.

4. The display apparatus according to claim 3, wherein the at least one supporting layer comprises:
   a first supporting layer close to the cover plate, and
   a second supporting layer located on one side, away from the cover plate, of the first supporting layer;
   wherein the first supporting layer is configured as the haze layer.

5. The display apparatus according to claim 4, wherein a haze of the second supporting layer is smaller than or equal to 1%.

6. The display apparatus according to claim 1, comprising at least one optical adhesive layer located between the display substrate and the cover plate;
   wherein any one of the at least one optical adhesive layer is configured as the haze layer.

7. The display apparatus according to claim 1, wherein the selective reflecting film layer is a composite film layer composed of at least two materials, and refractive indexes of the at least two materials are different.

8. The display apparatus according to claim 7, wherein the metal reflecting layer comprises an aluminum metal film layer; and
   the selective reflecting film layer comprises a $SiN_x/SiO_2/SiN_x$ composite film layer.

9. The display apparatus according to claim 8, wherein in the $SiN_x/SiO_2/SiN_x$ composite film layer, a thickness of a $SiO_2$ film layer ranges from 50 nm to 170 nm; and
   an international commission on illumination (CIE) color system brightness value of the display apparatus ranges from 60 to 80.

10. The display apparatus according to claim 7, wherein the metal reflecting layer comprises a molybdenum metal film layer; and
    the selective reflecting film layer comprises a $SiN_x/SiO_2/SiN_x$ composite film layer.

11. The display apparatus according to claim 10, wherein in the $SiN_x/SiO_2/SiN_x$ composite film layer, a thickness of a $SiO_2$ film layer ranges from 50 nm to 190 nm; and
    a CIE color system brightness value of the display apparatus ranges from 30 to 60.

12. The display apparatus according to claim 1, wherein the metal reflecting layer has a plurality of first openings;
    the plurality of first openings are configured to expose organic light-emitting diode (OLED) elements of the display substrate; and
    an overlapping area between the metal reflecting layer and an opening of a pixel defining layer of the display substrate is smaller than 20%.

13. The display apparatus according to claim 1, wherein the haze layer has a plurality of second openings, and the plurality of second openings are configured to expose OLED elements of the display substrate.

14. The display apparatus according to claim 1, wherein the haze layer comprises a plurality of haze parts distributed in an array, and the plurality of haze parts are configured to cover OLED elements of the display substrate.

15. The display apparatus according to claim 1, wherein the haze of the haze layer is 25%.

16. The display apparatus according to claim 1, wherein the haze layer comprises an adhesive material and scattering particles; and
    the scattering particles are dispersed in the adhesive material; or the scattering particles are coated on a surface of one side, facing the cover plate, of the adhesive material.

17. The display apparatus according to claim 16, wherein the scattering particles are spherical, and diameters of the scattering particles range from 2 μm to 9 μm.

18. The display apparatus according to claim 16, wherein the haze layer comprises at least two types of scattering particles with different diameters.

19. The display apparatus according to claim 16, wherein the adhesive material is a tri-cellulose acetate material; and
    the scattering particles are acrylic materials or silica materials.

* * * * *